(12) United States Patent
Tanaka (10) Patent No.: US 8,738,314 B2
(45) Date of Patent: May 27, 2014

(54) HIGH FREQUENCY MEASUREMENT APPARATUS AND CALIBRATION METHOD FOR HIGH FREQUENCY MEASUREMENT APPARATUS

(75) Inventor: Ryohei Tanaka, Osaka (JP)

(73) Assignee: Daihen Corporation, Osaka (JP)

( * ) Notice: Subject to any disclaimer, the term of this patent is extended or adjusted under 35 U.S.C. 154(b) by 407 days.

(21) Appl. No.: 13/240,671

(22) Filed: Sep. 22, 2011

(65) Prior Publication Data

US 2012/0084037 A1    Apr. 5, 2012

(30) Foreign Application Priority Data

Sep. 30, 2010    (JP) ................................. 2010-221836

(51) Int. Cl.
*G01R 35/00* (2006.01)
*G06F 19/00* (2011.01)
*G01R 27/28* (2006.01)
*G01R 27/04* (2006.01)

(52) U.S. Cl.
CPC .............. *G01R 35/005* (2013.01); *G01R 27/28* (2013.01); *G01R 27/04* (2013.01)
USPC ............. 702/85; 324/76.39; 702/64; 702/107

(58) Field of Classification Search
CPC ...... G01R 27/04; G01R 27/28; G01R 35/005; H01J 37/32183; H01J 37/32937; H01J 37/32091; H01J 37/32935

USPC .............. 702/64, 85, 107, 116; 324/601, 707, 324/76.39
See application file for complete search history.

(56) References Cited

U.S. PATENT DOCUMENTS 8,510,071 B2 *   8/2013   Tanaka .......................... 702/107

FOREIGN PATENT DOCUMENTS

JP    2004-309132    11/2004
JP    2007-163308     6/2007

* cited by examiner

*Primary Examiner* — John H Le
(74) *Attorney, Agent, or Firm* — Hamre, Schumann, Mueller & Larson, P.C.

(57) ABSTRACT

A method for calibrating voltage and current detected by a high frequency measurement apparatus is provided. By the method, a basic calibration parameter for a wide impedance range but with low accuracy and quadrant-specific calibration parameters for highly accurate calibration are calculated. This calculation is performed based on values obtained by measuring three reference loads and true values of the reference loads. A first calibration unit of the apparatus calibrates the detected voltage and current by using the basic calibration parameter. A quadrant determining unit of the apparatus determines in which quadrant an impedance calculated from the calibrated voltage and current lies. A second calibration unit of the apparatus further calibrates the voltage and current by using a quadrant-specific calibration parameter corresponding to the determination result input from the quadrant determining unit.

8 Claims, 7 Drawing Sheets

HIGH FREQUENCY MEASUREMENT APPARATUS AND CALIBRATION METHOD FOR HIGH FREQUENCY MEASUREMENT APPARATUS

BACKGROUND OF THE INVENTION

1. Field of the Invention

The present invention relates to a high frequency measurement apparatus and a calibration method for the high frequency measurement apparatus.

2. Description of Related Art:

A plasma processing system has heretofore been developed in which high frequency power output from a high frequency power source apparatus is supplied to a plasma processing apparatus so as to process a workpiece such as a semiconductor wafer or a liquid crystal substrate by using a method such as etching.

Figure 11:
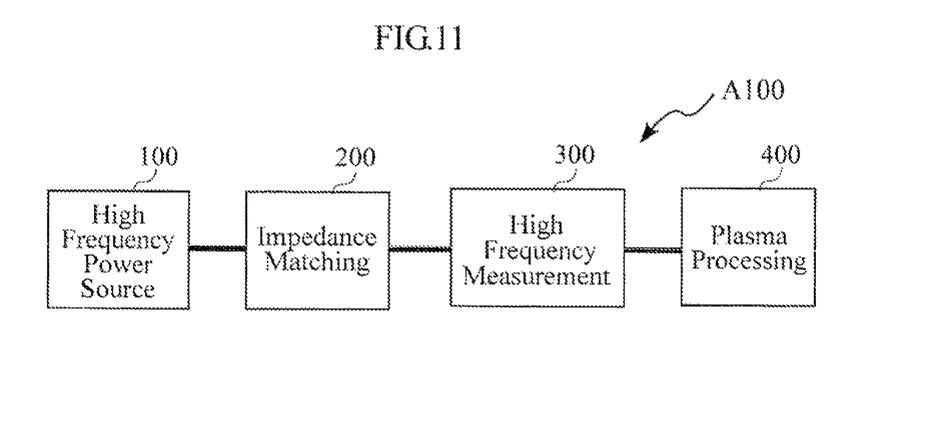
FIG. 11 is a block diagram showing the configuration of a generally used plasma processing system.

FIG. 11 is a block diagram showing the configuration of a generally used plasma processing system.

The impedance of a plasma processing apparatus 400 varies during plasma processing. Accordingly, the reflected wave power reflected at an input terminal of the plasma processing apparatus 400 may cause damage to a high frequency power source apparatus 100. For this reason, in a plasma processing system A100, generally, an impedance matching apparatus 200 is provided between the high frequency power source apparatus 100 and the plasma processing apparatus 400 so that the impedance matching apparatus 200 can perform a matching operation according to the impedance variation of the plasma processing apparatus 400. Also, it is necessary to monitor the impedance of the plasma processing apparatus 400 during plasma processing, as well as high frequency voltage, high frequency current and the like at the input terminal of the plasma processing apparatus 400.

Monitoring of the plasma processing apparatus 400 is performed by using various types of high frequency parameters measured by a high frequency measurement apparatus 300 provided at the input terminal of the plasma processing apparatus 400. The matching operation of the impedance matching apparatus 200 is performed by control based on various types of high frequency parameters measured by a high frequency measurement apparatus (not shown) provided inside the impedance matching apparatus 200. The following description will be given taking the high frequency measurement apparatus 300 as an example.

The high frequency measurement apparatus 300 detects a high frequency voltage (hereinafter referred to simply as a "voltage") and a high frequency current (hereinafter referred to simply as a "current"), determines a phase difference $\theta$ between voltage and current (hereinafter referred to simply as a "phase difference") from the detected values, and calculates high frequency parameters including a voltage effective value V, a current effective value I, an impedance $Z=R+jX$ (corresponding to the impedance of the plasma processing apparatus 400 because the measurement point is near the input terminal of the plasma processing apparatus 400), a magnitude of a reflection coefficient $\Gamma$, a traveling wave power Pf input into the plasma processing apparatus 400, a reflected wave power Pr reflected at the input terminal of the plasma processing apparatus 400 due to impedance mismatch, and the like.

The high frequency measurement apparatus 300 includes a capacitor capacitively coupled to a rod-shaped conductor for transmitting power to the plasma processing apparatus 400 and a coil magnetically coupled to the conductor, and detects a voltage $v=\sqrt{2} \cdot V \cdot \sin(\omega t)$ with the capacitor and a current $i=\sqrt{2} \cdot I \cdot \sin(\omega t+\theta)$ with the coil. Also, the high frequency measurement apparatus 300 determines a voltage effective value V, a current effective value I and a phase difference from the detected voltage v and current i, and calculates high frequency parameters as described above by Equations (1) to (5) given below by using the determined values. In other words, the high frequency measurement apparatus 300 is what is called an RF sensor that includes a sensor that detects voltage v and current i and an arithmetic processing circuit that calculates high frequency parameters as described above from the detected values of the sensor.

$$R = \frac{V}{I}\cos\theta \tag{1}$$

$$X = \frac{V}{I}\sin\theta \tag{2}$$

$$Z = R + jX$$

$$|\Gamma| = \sqrt{\left(\frac{R^2+X^2-1}{(R+1)^2+X^2}\right)^2 + \left(\frac{2 \cdot X}{(R+1)^2+X^2}\right)^2} \tag{3}$$

$$Pf = \frac{V \cdot I \cdot \cos\theta}{1-\Gamma^2} \tag{4}$$

$$Pr = Pf \cdot \Gamma^2 \tag{5}$$

Generally, metrology apparatuses and measurement apparatuses have different sensor sensitivities, and thus the detected value detected by the sensor is different from the correct value. Accordingly, a configuration is used in which a calibration parameter for converting a detected value to the correct value is obtained in advance by measuring a measurement target, which is used as a reference, and in the actual measurement, a value detected by the sensor is calibrated to the correct value using the calibration parameter and then output.

For calibration of the voltage v and current i detected by the high frequency measurement apparatus 300, for example, SOLT (Short-Open-Load-Thru) calibration is used. With SOLT calibration, first, the high frequency measurement apparatus 300 is connected to a reference load whose true impedance value has been pre-specified, and the high frequency measurement apparatus 300 measures the impedance. As the reference load, a dummy load having a characteristic impedance of a measuring system (the characteristic impedance of a transmission line that transmits high frequency waves for measurement, and generally, 50Ω or 75Ω is used), and dummy loads having impedances close to an open impedance (infinity) and a short-circuit impedance (zero), respectively, are used. Next, a calibration parameter for calibrating the voltage v and current i is calculated from the impedances of the reference loads measured by the high frequency measurement apparatus 300 and the true impedance values of the reference loads and then recorded in a memory (not shown) of the high frequency measurement apparatus 300. In the actual measurement, the detected voltage v and current i is calibrated by using the calibration parameter recorded in the memory, and then various types of high frequency parameters are calculated.

The calibration parameter recorded in the memory of the high frequency measurement apparatus 300 is calculated based on the characteristic impedance and the impedances close to the open impedance (infinity) and the short-circuit impedance (zero) that are limit values, respectively, and therefore calibration can be performed in an extremely wide impedance range.

However, the calibration parameter described above is determined such that calibration can be performed in an extremely wide impedance range, and thus the accuracy of the calibration using the calibration parameter is not sufficiently high. In other words, the calibration parameter described above is a calibration parameter with which calibration can be performed in an extremely wide impedance range but with low accuracy. However, in the case where measured values obtained from the high frequency measurement apparatus 300 are actually used to monitor the plasma processing apparatus 400, highly accurate calibration is required. For example, the plasma processing apparatus 400 emits high heat during plasma processing, and thus the ambient temperature of the high frequency measurement apparatus 300 that is disposed near the plasma processing apparatus 400 increases. Because the resistive component changes with temperature changes, if the ambient temperature when calibration was performed and the ambient temperature when the actual measurement is performed differ from each other, the calibration accuracy decreases. In view of this, it is necessary to perform calibration with high accuracy.

Also, it is often the case that, in plasma processing, the phase difference θ between the detected voltage v and current i takes a value close to $(1/2)\pi$. Accordingly, even a small error in the phase difference θ will result in an increased rate of change of cos θ, exerting significant influence on the measured values for a resistive component R of impedance and a traveling wave power Pf (see Equations (1) and (4) given above). Hence, in order to suppress errors in the phase difference θ, it is necessary to perform calibration with high accuracy.

Also, there are cases where the measured values obtained from the high frequency measurement apparatus 300 are used in an E-chuck controller or the like. The E-chuck controller controls the strength of an electrostatic chuck for fixing a wafer in a chamber of the plasma processing apparatus 400, based on the measured current value and voltage value. Accordingly, it is necessary to suppress errors in the measured current value and voltage value within an extremely small range and also to minimize difference in characteristics between devices. For this reason, the detected values of the high frequency measurement apparatus 300 need to be calibrated with high accuracy.

SUMMARY OF THE INVENTION

The present invention has been proposed under the circumstances described above. Accordingly, it is an object of the present invention to provide a method for calibrating voltage and current detected by a high frequency measurement apparatus with high accuracy. It is another object of the present invention to provide a high frequency measurement apparatus capable of performing such calibration.

A high frequency measurement apparatus provided according to a first aspect of the present invention is connected to a connection point between a load including a plasma processing apparatus and a high frequency power source apparatus and detects high frequency voltage and high frequency current at the connection point. The high frequency measurement apparatus includes: a voltage detector for detecting high frequency voltage at the connection point; a current detector for detecting high frequency current at the connection point; a calibrator for calibrating a voltage value detected by the voltage detector and a current value detected by the current detector; and an impedance calculator for calculating an impedance as viewed from the connection point toward the load based on the voltage value and current value calibrated by the calibrator. The calibrator includes: a first calibration unit for calibrating the detected voltage value and current value by using a basic parameter calculated based on three impedances calculated by the impedance calculator when the high frequency measurement apparatus is connected to each of three basic reference loads and impedances of the three basic reference loads; a determiner for determining in which range an impedance calculated from the voltage value and current value calibrated by the first calibration unit lies when the impedance is indicated in a Smith chart whose entire impedance range is divided into a plurality of ranges; and a second calibration unit for further calibrating the voltage value and current value calibrated by the first calibration unit by using a range-specific parameter calculated based on three impedances calculated by the impedance calculator when the high frequency measurement apparatus is connected to each of three range-specific reference loads having three impedances that enclose a range determined to be the range in which the impedance lies by the determiner and impedances of the three range-specific reference loads.

High frequency measurement apparatuses include a high frequency measurement apparatus that is connected to a plasma processing apparatus and that measures high frequency parameters to monitor the plasma processing apparatus, a high frequency measurement apparatus that is provided inside an impedance matching apparatus and that measures high frequency parameters to control matching operations, and the like. The detected voltage value and current value can be, for example, a voltage value and a current value that have been digitized, a voltage effective value and a current effective value, a maximum voltage value and a maximum current value, or the like.

Preferably, the range that is divided into a plurality of ranges is divided by a straight line passing through a point indicating a characteristic impedance serving as a center in the Smith chart.

Preferably, the range that is divided into a plurality of ranges is divided into four by a straight line passing through a point indicating an open impedance and a straight line orthogonal to the straight line.

Preferably, the determiner determines in which range the impedance lies based on a reflection coefficient phase angle calculated from the voltage value and current value calibrated by the first calibration unit.

Preferably, the determiner provides hysteresis characteristics to a timing at which a determination result thereof is switched.

Preferably, one of the three basic reference loads and one of the three range-specific reference loads is a load having the same impedance as a characteristic impedance of the high frequency measurement apparatus.

A calibration method provided according to a second aspect of the present invention is a method for calibrating high frequency voltage and high frequency current of a high frequency measurement apparatus that is connected to a connection point between a load to be measured including a plasma processing apparatus and a high frequency power source apparatus, that detects high frequency voltage and high frequency current at the connection point, and that calculates an impedance as viewed from the connection point toward the load based on a detected voltage value and current value. The calibration method includes: a first step of calculating a basic parameter for calibrating the voltage value and current value based on three impedances calculated when the high frequency measurement apparatus is connected to each of three basic reference loads and impedances of the three basic reference loads, and setting the basic parameter in the high frequency measurement apparatus; a second step of calculating a range-specific parameter for further calibrating the voltage value and current value calibrated by using the basic parameter on a range basis based on three impedances calculated when the high frequency measurement apparatus is connected to each of three reference loads having three impedances that enclose each range obtained by dividing an entire impedance range into a plurality of ranges and impedances of the three reference loads, and setting the range-specific parameter in the high frequency measurement apparatus; and a third step of connecting the high frequency measurement apparatus to the load to be measured, and calibrating the detected voltage value and current value by using the basic parameter and the range-specific parameter.

Preferably, the range-specific parameter used in the third step is a range-specific parameter corresponding to a range in which an impedance calculated based on the voltage value and current value calibrated by using the basic parameter lies.

According to the present invention, the impedance as viewed from the connection point toward the load is calculated based on the calibrated voltage value and current value. First, the voltage value and current value detected when connected to a load to be measured are calibrated by using a basic parameter calculated based on three basic reference loads, and the impedance is calculated. Next, it is determined in which range the calculated impedance lies, and the voltage value and current value are further calibrated by using a range-specific parameter corresponding to the determined range.

The range-specific parameter is a parameter for performing calibration in an impedance range smaller than that using the basic parameter, and thus if the impedance falls within the range, the accuracy of the calibration using the range-specific parameter will be sufficiently high.

Accordingly, the detected voltage value and current value can be calibrated with high accuracy.

Other features and advantages of the present invention will be more apparent from the following detailed description of the invention with reference to the accompanying drawings.

DETAILED DESCRIPTION OF THE PREFERRED EMBODIMENTS

Hereinafter, embodiments of the present invention will be described in detail with reference to the accompanying drawings, taking a high frequency measurement apparatus used to monitor a plasma processing apparatus as an example.

Figure 1:
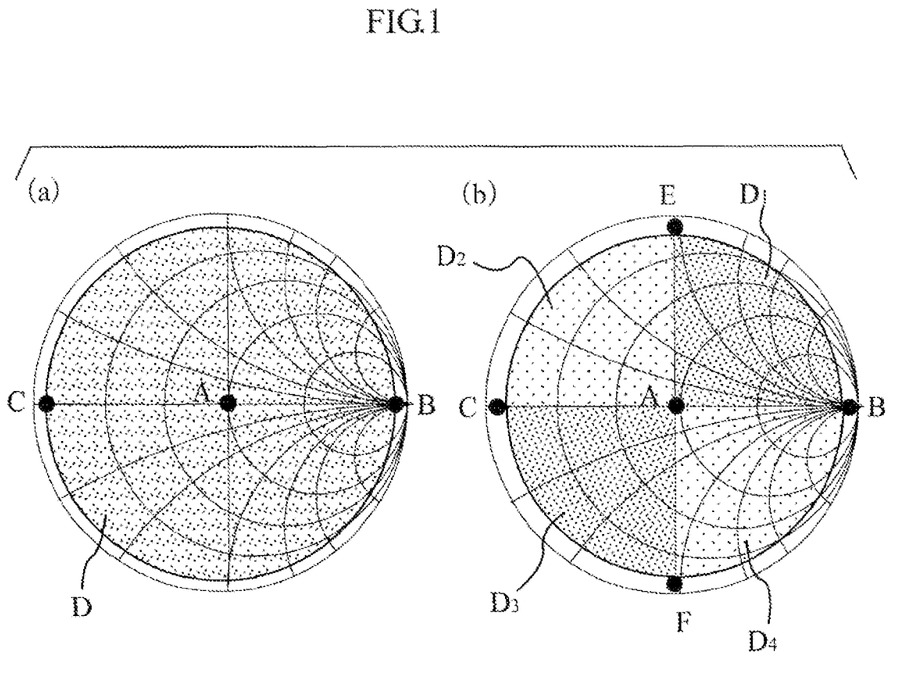
FIGS. 1(a) and 1(b) are diagrams illustrating a calibration method according to the present invention.

FIGS. 1(a) and 1(b) are diagrams illustrating the concept of a calibration method according to the present invention, showing the position of each impedance in a Smith chart.

Points A, B and C shown in FIG. 1(a) respectively indicate the positions of a characteristic impedance of 50Ω, an impedance close to an open impedance (infinity) and an impedance close to a short-circuit impedance (zero). With a calibration parameter calculated by using the impedances at points A, B and C as a reference, calibration can be performed in a range D enclosed by the points A, B and C, or in other words, in almost the entire impedance range of the Smith chart. However, the accuracy of the calibration parameter is low, and in particular, the accuracy for an impedance having a small resistive component is low. In other words, the calibration parameter is for performing less accurate calibration in a wide impedance range.

By reducing the range enclosed by the points used as a reference to calculate a calibration parameter, it is possible to calculate a calibration parameter that has high accuracy for the impedances within the range and low accuracy for the impedances outside the range.

Point E shown in FIG. 1(b) indicates the position of an impedance close to the impedance whose resistive component is zero and whose inductive reactance component is 50Ω. Points A and B shown in FIG. 1(b) are the same as the points A and B shown in FIG. 1(a). With a calibration parameter calculated by using the impedances at points A, B and E as a reference, highly accurate calibration can be performed within an impedance range $D_1$ enclosed by the points A, B and E, but the accuracy for the impedances outside the range is low. Likewise, with a calibration parameter calculated by using the impedances at points A, C and E as a reference, highly accurate calibration can be performed within an impedance range $D_2$ enclosed by the points A, C and E. With a calibration parameter calculated by using the impedances at points A, C and F as a reference (point F indicates the position of an impedance close to the impedance whose resistive component is zero and whose capacitive reactance component is 50Ω), highly accurate calibration can be performed within an impedance range $D_3$ enclosed by the points A, C and F. With a calibration parameter calculated by using the impedances at points A, B and F as a reference, highly accurate calibration can be performed within an impedance range $D_4$ enclosed by the points A, B and F.

The present invention performs multiple-stage calibration in which calibration is performed by using a calibration parameter with which calibration can be performed in a wide impedance range but with low accuracy, it is determined in which range of the Smith chart the calibrated impedance lies, and calibration is further performed by using a calibration parameter with which highly accurate calibration can be performed within the range where the impedance lies.

The present embodiment will be described in the context where the range of a Smith chart is divided into four ranges $D_1$, $D_2$, $D_3$ and $D_4$ as shown in FIG. 1(b). Hereinafter, the ranges $D_1$, $D_2$, $D_3$ and $D_4$ will be referred to as the first quadrant, the second quadrant, the third quadrant, and the fourth quadrant of the Smith chart, respectively.

Figure 2:
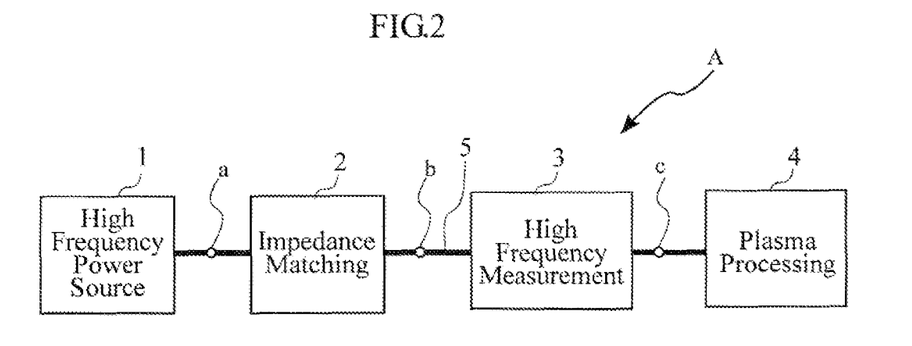
FIG. 2 is a block diagram illustrating the configuration of a plasma processing system using a high frequency measurement apparatus according to a first embodiment of the present invention.

FIG. 2 is a block diagram illustrating the configuration of a plasma processing system using a high frequency measurement apparatus according to a first embodiment of the present invention.

A plasma processing system A is a system that performs processing such as plasma etching on a workpiece such as a semiconductor wafer or a liquid crystal substrate by supplying high frequency power. As shown in FIG. 2, the plasma processing system A includes a high frequency power source apparatus 1, an impedance matching apparatus 2, a high frequency measurement apparatus 3 and a plasma processing apparatus 4. The high frequency power source apparatus 1 is connected to the impedance matching apparatus 2 via, for example, a transmission line composed of a coaxial cable. The impedance matching apparatus 2 is connected to the plasma processing apparatus 4 via, for example, a rod-shaped transmission line 5 made of copper or the like. The high frequency measurement apparatus 3 is disposed on the transmission line 5. The plasma processing system A is configured as a system whose characteristic impedance is 50Ω.

The high frequency power source apparatus 1 is a power source apparatus that supplies high frequency power and is capable of outputting high frequency power having, for example, a frequency of several hundreds of kilohertz (kHz) or more.

The impedance matching apparatus 2 is an apparatus that matches impedances between the high frequency power source apparatus 1 and the plasma processing apparatus 4. The impedance matching apparatus 2 includes a variable reactance element (not shown) such as a variable capacitance or variable inductance, and changes impedance by changing the reactance of the variable reactance element. The impedance matching apparatus 2 converts the impedance as viewed from an output terminal b of the impedance matching apparatus 2 toward the load such that the impedance as viewed from an input terminal a of the impedance matching apparatus 2 toward the load becomes the characteristic impedance.

The impedance matching apparatus 2 includes a high frequency measurement apparatus (not shown) on the power source side. The high frequency measurement apparatus is an apparatus that measures the impedance as viewed from the input terminal a of the impedance matching apparatus 2 toward the load, and the impedance matching apparatus 2 changes the reactance of the variable reactance element such that the measured impedance becomes the characteristic impedance.

The plasma processing apparatus 4 is an apparatus for processing a workpiece such as a semiconductor wafer or a liquid crystal substrate by a method such as etching or CVD. Although not shown in the diagram, the plasma processing apparatus 4 includes a container (chamber) for enclosing a predetermined gas for generating a plasma such as nitrogen gas or argon gas and a pair of electrodes for supplying the high frequency power from the high frequency power source apparatus 1 to the gas contained in the container.

The high frequency measurement apparatus 3 is what is called an RF sensor that measures the impedance of the plasma processing apparatus 4, as well as high frequency parameters at an input terminal c of the plasma processing apparatus 4, such as high frequency voltage, high frequency current, a reflection coefficient, traveling wave power and reflected wave power, in order to monitor the state of the plasma processing apparatus 4 during plasma processing. The measured impedance is the impedance as viewed from a point (measurement point) at which high frequency voltage and high frequency current are detected toward the load. Because the measurement point is near the input terminal c of the plasma processing apparatus 4, the measured impedance corresponds to the impedance of the plasma processing apparatus 4.

Figure 3:
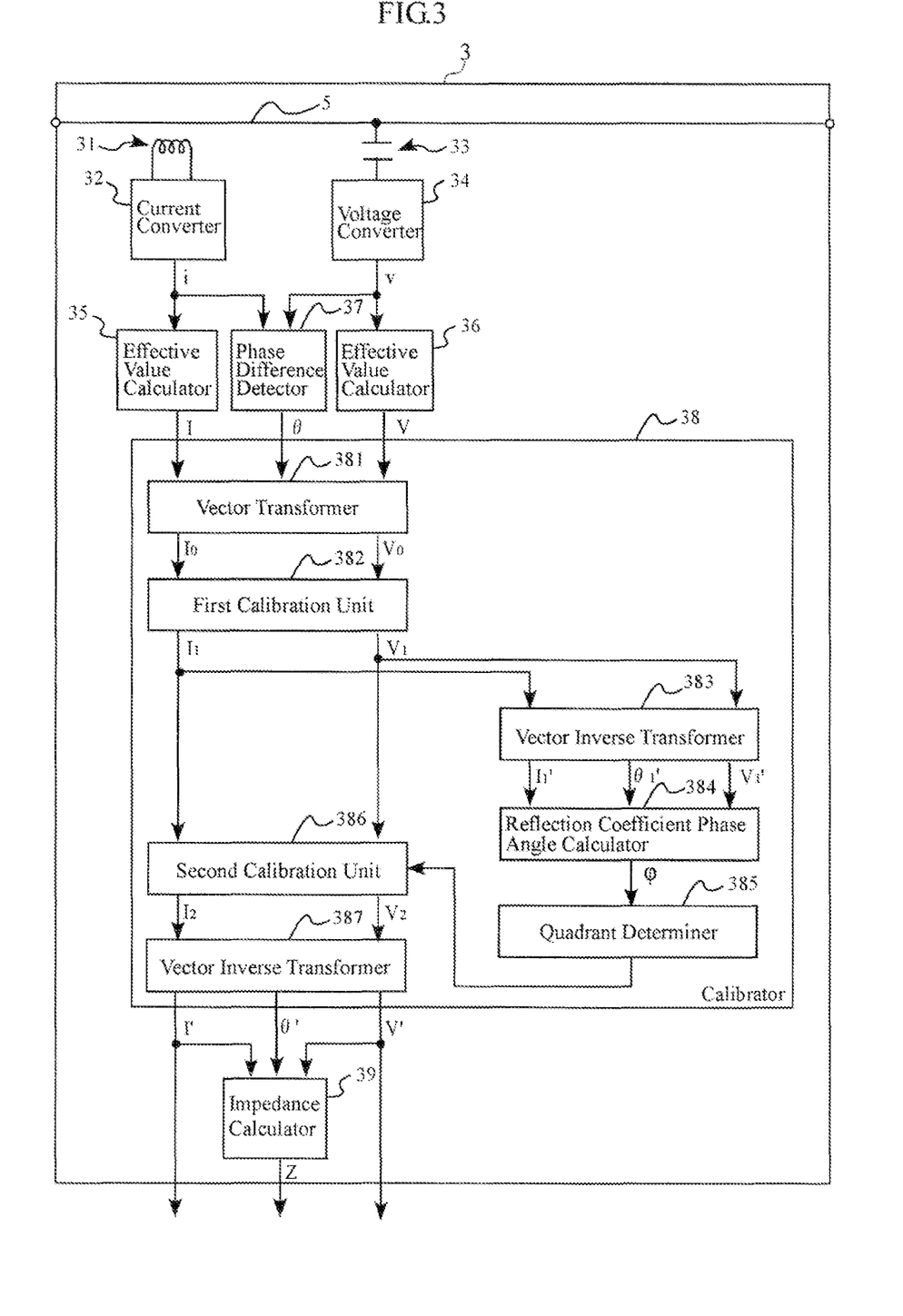
FIG. 3 is a block diagram illustrating the internal configuration of the high frequency measurement apparatus according to the first embodiment.

FIG. 3 is a block diagram illustrating the internal configuration of the high frequency measurement apparatus 3.

As shown in FIG. 3, the high frequency measurement apparatus 3 includes a current transformer unit 31, a current converter circuit 32, a capacitor unit 33, a voltage converter circuit 34, effective value calculation circuits 35 and 36, a phase difference detection circuit 37, a calibration circuit 38 and an impedance calculation circuit 39.

The current transformer unit 31 is a unit that detects current according to the high frequency current that flows through the transmission line 5 and outputs the detected current to the current converter circuit 32. The current converter circuit 32 converts the input current to a current signal i that is a digital signal and outputs the current signal i to the effective value calculation circuit 35 and the phase difference detection circuit 37. The capacitor unit 33 is a unit that detects voltage according to the high frequency voltage that occurs in the transmission line 5 and outputs the detected voltage to the voltage converter circuit 34. The voltage converter circuit 34 converts the input voltage to a voltage signal v that is a digital signal and outputs the voltage signal v to the effective value calculation circuit 36 and the phase difference detection circuit 37.

The effective value calculation circuit 35 is a circuit that calculates a current effective value. The effective value calculation circuit 35 calculates a current effective value I from the current signal i input by the current converter circuit 32 and outputs the current effective value I to the calibration circuit 38. The effective value calculation circuit 36 is a circuit that calculates a voltage effective value. The effective value calculation circuit 36 calculates a voltage effective value V from the voltage signal v input by the voltage converter circuit 34 and outputs the voltage effective value V to the calibration circuit 38. The phase difference detection circuit 37 is a circuit that detects a phase difference between current and voltage. The phase difference detection circuit 37 calculates a phase difference θ from the current signal i input by the current converter circuit 32 and the voltage signal v input by the voltage converter circuit 34 and outputs the phase difference θ to the calibration circuit 38.

The calibration circuit 38 is a circuit that calibrates the current effective value I, the voltage effective value V and the phase difference θ. The calibration circuit 38 calibrates the current effective value I input by the effective value calculation circuit 35, the voltage effective value V input by the effective value calculation circuit 36, and the phase difference θ input by the phase difference detection circuit 37, and outputs a current effective value I', a voltage effective value V' and a phase difference θ' obtained as a result of the calibration to the impedance calculation circuit 39.

The calibration circuit 38 includes a vector transforming unit 381, a first calibration unit 382, a vector inverse transforming unit 383, a reflection coefficient phase angle calculation unit 384, a quadrant determining unit 385, a second calibration unit 386 and a vector inverse transforming unit 387, and performs two-stage calibration on the current and voltage that are vectors.

The vector transforming unit 381 calculates a current signal $I_0$ and a voltage signal $V_0$ that are vectors from the input current effective value I, the voltage effective value V and the phase difference θ and outputs a current signal $I_0$ and a voltage signal $V_0$ to the first calibration unit 382. The current signal $I_0$ and the voltage signal $V_0$ are calculated by the following equations by using the phase of the current signal $I_0$ (real axis, imaginary part 0) as a reference:

$$I_0 = I + j0 \text{ and}$$

$$V_0 = V\cos\theta + jV\sin\theta.$$

The first calibration unit 382 performs first calibration (hereinafter referred to as a "basic calibration") on the current signal $I_0$ and the voltage signal $V_0$ input from the vector transforming unit 381 by using a basic calibration parameter X recorded in a memory (not shown) and outputs a current signal $I_1$ and a voltage signal $V_1$ obtained as a result of the basic calibration to the vector inverse transforming unit 383 and the second calibration unit 386.

Figure 4:
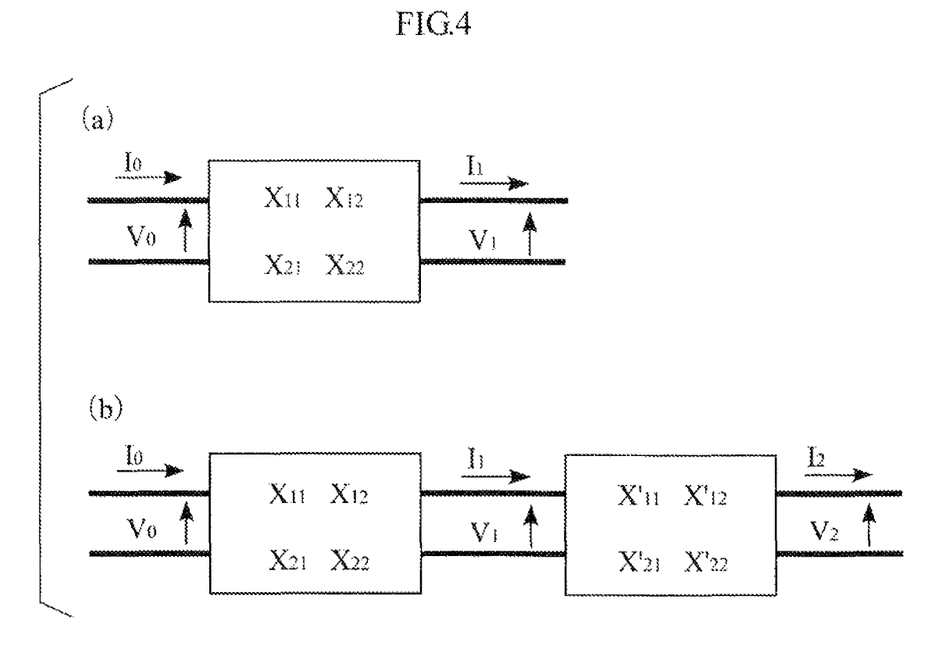
FIGS. 4(a) and 4(b) are diagrams illustrating a basic calibration parameter and a quadrant-specific calibration parameter.

The basic calibration parameter X is a calibration parameter with which calibration can be performed in a wide impedance range but with low accuracy. The basic calibration parameter X is calculated based on three reference loads and recorded in the memory. The method for calculating the basic calibration parameter X will be described below.

Where the relationship between the current signal $I_0$ and the voltage signal $V_0$ output from the vector transforming unit 381 and the high frequency current flowing through the transmission line 5 and the high frequency voltage that occurs in the transmission line 5 is applied to a two-terminal pair network, the basic calibration parameter X for calibrating the current signal $I_0$ and the voltage signal $V_0$ to a current signal $I_1$ and a voltage signal $V_1$ can be assumed as a two-dimensional vector matrix shown in FIG. 4(*a*).

The high frequency measurement apparatus 3 is connected to three reference loads and the impedance of each reference load is measured by the high frequency measurement apparatus 3. From the measured impedance values and the true impedance values of the three reference loads, elements $X_{11}$, $X_{12}$, $X_{21}$ and $X_{22}$ of the basic calibration parameter X can be calculated. This calculation requires the absolute values of the voltage value and current value that are used as a reference. In order to use the absolute values of the voltage value and current value as reference values, a measured power value of high accuracy is required. In order to measure a measured power value of high accuracy, it is best to connect a load with a reflected power of 0 to the high frequency measurement apparatus 3 to perform measurement. Accordingly, in the present embodiment, in order to achieve a reflected power of 0, a load having an impedance that is the same as the characteristic impedance (specifically, 50Ω) is selected as one of the reference loads. As just described, the reason that a load having the characteristic impedance is used as one of the reference loads is to measure a measured power value of high accuracy, and therefore if the measured power value can be measured with high accuracy, a load other than the load having the characteristic impedance may be used.

When the high frequency measurement apparatus 3 is connected to reference loads and the impedances of the reference loads are actually measured, the high frequency measurement apparatus 3 cannot measure impedance at the input terminal of the reference loads, and the measured impedances include the impedance of the high frequency measurement apparatus 3. Accordingly, the impedances of the reference loads cannot be used as true values to calculate the basic calibration parameter X. In the present embodiment, the high frequency measurement apparatus 3 and a load connected thereto as a whole are assumed to be a reference load, the impedance of the reference load is measured by an impedance analyzer and the basic calibration parameter X is calculated by using the measured value as the true value of the reference load.

It is desirable that two out of the three reference loads are loads having impedances close to the open impedance and the short-circuit impedance, respectively, in order to include an impedance range as wide as possible. However, if a load having an impedance that is too close to the open or short-circuit impedance is used as a reference load, or if one of the voltage value and current value detected by the high frequency measurement apparatus 3 is much smaller than the other, quantization errors may exert large influence depending on the resolution of an AD converter that digitizes the voltage value and current value. In this case, the elements $X_{11}$, $X_{12}$, $X_{21}$ and $X_{22}$ of the basic calibration parameter X cannot be appropriately calculated. Accordingly, in the present embodiment, loads having a reflection coefficient of, for example, 0.9 or less are used as reference loads.

Figure 5:
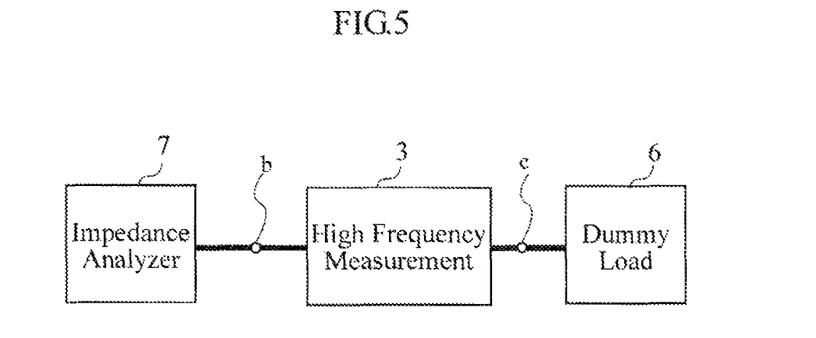
FIG. 5 is a diagram illustrating a method for measuring the impedance of a reference load, which is performed to calculate each element of the basic calibration parameter.

FIG. 5 is a diagram illustrating a method for measuring the impedance of a reference load, performed to calculate the elements $X_{11}$, $X_{12}$, $X_{21}$, $X_{22}$ of the basic calibration parameter X.

As shown in FIG. 5, the measurement is performed by connecting a dummy load 6 to an output terminal c of the high frequency measurement apparatus 3 and connecting an impedance analyzer 7 to an input terminal b of the high frequency measurement apparatus 3. In order to have an environment that is the same as the environment in which the plasma processing apparatus 4 will actually be measured during operation, the components of the high frequency measurement apparatus 3 and the ambient temperature are kept at a predetermined temperature to measure the impedance of reference loads.

The dummy load 6 is a load apparatus for reproducing a predetermined reference load, and changes the impedance as viewed from the input terminal b of the high frequency measurement apparatus 3 toward the load, or in other words, the impedance of the entirety including the dummy load 6 and the high frequency measurement apparatus 3 to the impedance of a predetermined reference load. The dummy load 6 changes the impedance by changing the reactance of a variable reactance element (not shown) such as a variable capacitance or variable inductance. The dummy load 6 has been preset so as to be capable of reproducing a reference load having a characteristic impedance of 50Ω and two reference loads that are close to the open impedance and the short-circuit impedance, respectively, and that have a reflection coefficient of 0.9 or less as predetermined reference loads. Instead of reproducing three predetermined reference loads by connecting the dummy load 6 and switching the setting, three loads for reproducing predetermined reference loads may be connected in sequence.

The impedance analyzer 7 is an apparatus that measures impedance, and measures the impedance as viewed from the input terminal b of the high frequency measurement apparatus 3 toward the load, or in other words, the impedance of the reference load.

Measurement of the impedance of the reference load performed to calculate the basic calibration parameter X is performed by reproducing each reference load and measuring the impedance of the reference load by the impedance analyzer and the high frequency measurement apparatus 3. The impedance analyzer 7 may be omitted if there is a method for obtaining the true value of the impedance measured by the high frequency measurement apparatus 3.

The elements $X_{11}$, $X_{12}$, $X_{21}$ and $X_{22}$ of the basic calibration parameter X can be calculated from the impedance values of three reference loads measured by the high frequency measurement apparatus 3 and the true impedance values of the three reference loads. From FIG. 4(a), with the use of the calculated basic calibration parameter X, the current signal $I_0$ and the voltage signal $V_0$ can be converted to a current signal $I_1$ and a voltage signal $V_1$ obtained as a result of the basic calibration. Specifically, the current signal $I_1$ and the voltage signal $V_1$ obtained as a result of the basic calibration can be calculated by the following Equations (6) and (7) derived from FIG. 4(a).

$$\begin{bmatrix} V_0 \\ V_1 \end{bmatrix} = \begin{bmatrix} X_{11} & X_{12} \\ X_{21} & X_{22} \end{bmatrix} \begin{bmatrix} I_0 \\ -I_1 \end{bmatrix} \quad (6)$$

$$V_0 = X_{11} \cdot I_0 - X_{12} \cdot I_1$$

$$V_1 = X_{21} \cdot I_0 - X_{22} \cdot I_1$$

$$I_1 = \frac{X_{11}}{X_{12}} \cdot I_0 - \frac{1}{X_{12}} \cdot V_0$$

$$V_1 = \frac{(X_{12} \cdot X_{21} - X_{11} \cdot X_{22})}{X_{12}} \cdot I_0 + \frac{X_{22}}{X_{12}} \cdot V_0 \quad (7)$$

Reverting to FIG. 3, the vector inverse transforming unit 383 calculates a current effective value $I_1'$, a voltage effective value $V_1'$ and a phase difference $\theta_1'$ obtained as a result of the basic calibration from the current signal and the voltage signal $V_1$ obtained as a result of the basic calibration input from the first calibration unit 382, and outputs the current effective value $I_1'$, the voltage effective value $V_1'$, and the phase difference $\theta_1'$ to the reflection coefficient phase angle calculation unit 384. The reflection coefficient phase angle calculation unit 384 calculates a reflection coefficient phase angle $\phi$ from the current effective value $I_1'$, the voltage effective value $V_1'$ and the phase difference $\theta_1'$ obtained as a result of the basic calibration input from the vector inverse transforming unit 383, and outputs the reflection coefficient phase angle $\phi$ to the quadrant determining unit 385. The reflection coefficient phase angle calculation unit 384 calculates a resistive component R and a reactance component X of an impedance Z (=R+j·X) from the current effective value $I_1'$, the voltage effective value $V_1'$ and the phase difference $\theta_1'$ based on Equations (1) and (2) given above, and calculates a reflection coefficient phase angle $\phi$ based on Equation (8) given below. In the equation, Γr and Γi are the real part and the imaginary part of a reflection coefficient Γ (=Γr+j·Γi), respectively.

$$\Gamma r = \frac{R^2 + X^2 - 1}{(R+1)^2 + X^2} \quad (8)$$

$$\Gamma i = \frac{2 \cdot X}{(R+1)^2 + X^2}$$

$$\phi = \arctan\left(\frac{\Gamma i}{\Gamma r}\right)$$

The quadrant determining unit 385 determines in which quadrant of the Smith chart the impedance of the plasma processing apparatus 4 lies based on the reflection coefficient phase angle $\phi$ input from the reflection coefficient phase angle calculation unit 384, and outputs the determination result to the second calibration unit 386. The points in the Smith chart are plotted as the coordinates of the real part Γr and the imaginary part Γi of the reflection coefficient Γ by taking the position of the characteristic impedance as the origin.

Figure 6:
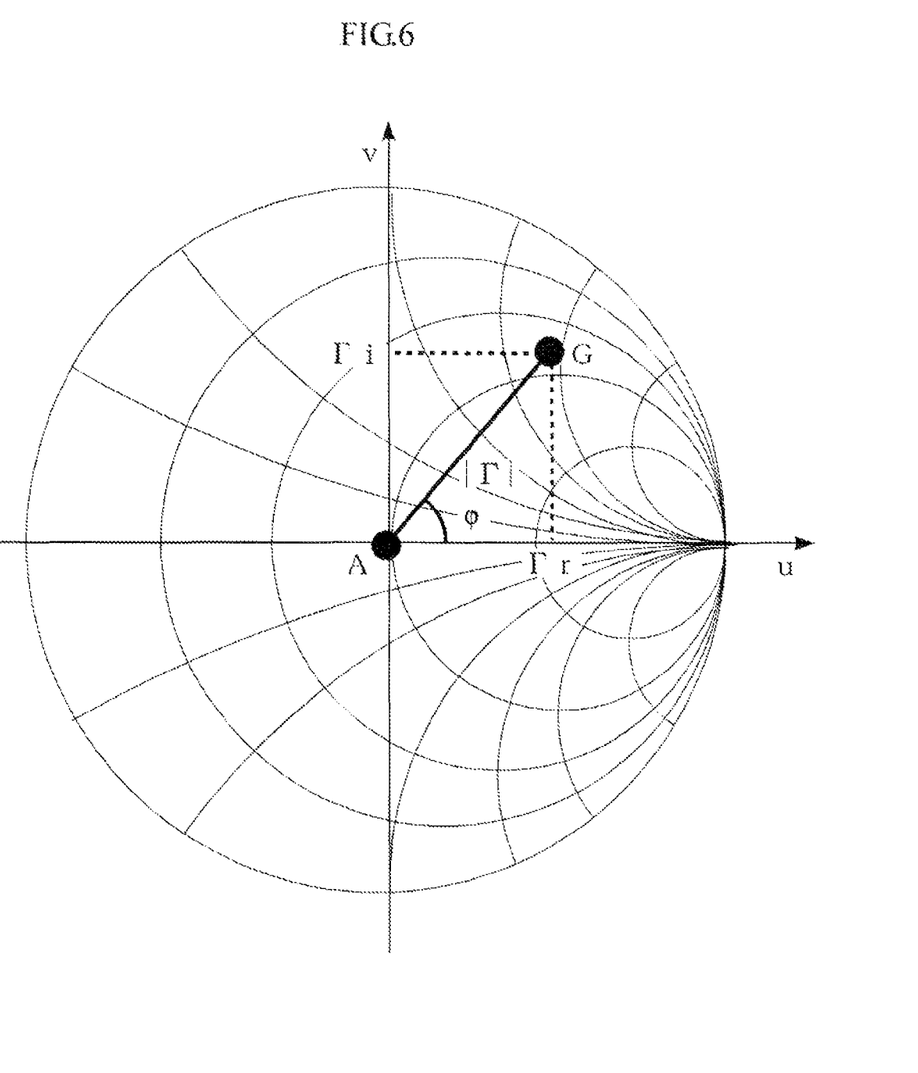
FIG. 6 is a diagram in which points in a Smith chart are plotted as the coordinates of a real part and an imaginary part of a reflection coefficient.

FIG. 6 is a diagram in which the points in the Smith chart are plotted as the coordinates of the real part Γr and the imaginary part Γi of the reflection coefficient Γ, which may generally be called a polar chart. Hereinafter, this diagram will also be referred to as the Smith chart. In FIG. 6, the u-axis is the real axis of the reflection coefficient and the v-axis is the imaginary axis of the reflection coefficient. Point G of the reflection coefficient Γ (=Γr+j·Γi) is plotted as a point in which the component of the u-axis (real axis) is Γr and the component of the v-axis (imaginary axis) is Γi. Also, the length of a line connecting the point G and the origin A represents $|\Gamma|=\sqrt{(\Gamma r^2+\Gamma i^2)}$, which is the magnitude of the reflection coefficient Γ. The angle between the line connecting the point G and the origin A and a positive direction of the u-axis represents the reflection coefficient phase angle $\phi=\arctan(\Gamma i/\Gamma r)$. Accordingly, it is possible to determine, from the reflection coefficient phase angle $\phi$, in which quadrant of the Smith chart the impedance lies.

If the reflection coefficient phase angle $\phi$ input from the reflection coefficient phase angle calculation unit 384 is $0 \leq \phi < (1/2)\pi$, the quadrant determining unit 385 determines that the impedance lies in the first quadrant of the Smith chart. If the reflection coefficient phase angle $\phi$ is $(1/2)\pi \leq \phi < \pi$, the quadrant determining unit 385 determines that the impedance lies in the second quadrant of the Smith chart. If the reflection coefficient phase angle $\phi$ is $\pi \leq \phi (3/2)\pi$, the quadrant determining unit 385 determines that the impedance lies in the third quadrant of the Smith chart. If the reflection coefficient phase angle $\phi$ is $(3/2)\pi \leq \phi < 2\pi$, the quadrant determining unit 385 determines that the impedance lies in the fourth quadrant of the Smith chart. The reflection coefficient phase angle $\phi$ input from the reflection coefficient phase angle calculation unit 384 is calculated from the current effective value $I_1'$ the voltage effective value $V_1'$ and the phase difference $\theta_1'$ obtained as a result of the basic calibration, and therefore is not so high in accuracy. However, the reflection coefficient phase angle $\phi$ has sufficient accuracy to determine in which quadrant of the Smith chart the impedance lies.

The second calibration unit 386 performs second calibration (hereinafter referred to as "quadrant-specific calibration") on the current signal $I_1$ and the voltage signal $V_1$ input from the first calibration unit 382 by using a quadrant-specific calibration parameter X' recorded in the memory and outputs a current signal $I_2$ and a voltage signal $V_2$ obtained as a result of the quadrant-specific calibration to the vector inverse transforming unit 387. Four calibration parameters are recorded in the memory as the quadrant-specific calibration parameter X', namely, a first quadrant calibration parameter $X_1$ with which highly accurate calibration can be performed in the first quadrant, a second quadrant calibration parameter $X_2$ with which highly accurate calibration can be performed in the second quadrant, a third quadrant calibration parameter $X_3$ with which highly accurate calibration can be performed in the third quadrant, and a fourth quadrant calibration parameter $X_4$ with which highly accurate calibration can be performed in the fourth quadrant. The second calibration unit 386 determines a calibration parameter used as the quadrant-specific calibration parameter X' based on the determination result input from the quadrant determining unit 385. Specifically, if it is determined that the determination result indicates the first quadrant, the first quadrant calibration parameter $X_1$ is used as the quadrant-specific calibration parameter X'. If it is determined that the determination result indicates the second quadrant, the second quadrant calibration parameter $X_2$ is used as the quadrant-specific calibration parameter X'. If it is determined that the determination result indicates the third quadrant, the third quadrant calibration parameter $X_3$ is used as the quadrant-specific calibration parameter X'. If it is determined that the determination result indicates the fourth quadrant, the fourth quadrant calibration parameter $X_4$ is used as the quadrant-specific calibration parameter X'.

The quadrant calibration parameters $X_1$ to $X_4$ are each calculated based on three reference loads and recorded in the memory. The method for calculating the quadrant calibration parameters $X_1$ to $X_4$ is the same as the method for calculating the basic calibration parameter X described above.

In the same manner as described above, where the relationship between the current signal $I_1$ and the voltage signal $V_1$ output from the first calibration unit 382 and the high frequency current flowing through the transmission line and the high frequency voltage that occurs in the transmission line 5 is applied to a two-terminal pair network, the quadrant-specific calibration parameter X' for calibrating the current signal $I_1$ and the voltage signal $V_1$ to a current signal I, and a voltage signal $V_2$ can be assumed as a two-dimensional vector matrix shown on the right side of FIG. 4(b). FIG. 4(b) as a whole shows the calibration circuit 38 that converts the current signal $I_0$ and the voltage signal $V_0$ by using the basic calibration parameter X and the quadrant-specific calibration parameter X', which are two-dimensional vector matrices, and outputs a current signal and a voltage signal $V_2$ obtained as a result of the quadrant-specific calibration.

Similarly to the above, elements $X'_{11}, X'_{12}, X'_{21}$ and $X'_{22}$ of the quadrant-specific calibration parameter X' (quadrant-specific calibration parameters $X_1$ to $X_4$) are also calculated from the impedance values of three reference loads measured by the high frequency measurement apparatus 3 when the reference loads are reproduced and the true impedance values of the three reference loads.

One of three reference loads needs to be a load having a characteristic impedance of 50Ω, similarly to the above. In the case of the first quadrant calibration parameter $X_1$, as the remaining two reference loads, an impedance close to the open impedance and an impedance close to the impedance whose resistive component is zero and whose inductive reactance component is 50Ω are used so as to enclose the first quadrant (see FIG. 1(b)). In the case of the second quadrant calibration parameter $X_2$, an impedance close to the short-circuit impedance and an impedance close to the impedance whose resistive component is zero and whose inductive reactance component is 50Ω are used so as to enclose the second quadrant. In the case of the third quadrant calibration parameter $X_3$, an impedance close to the short-circuit impedance and an impedance close to the impedance whose resistive component is zero and whose capacitive reactance component is 50Ω are used so as to enclose the third quadrant. In the case of the fourth quadrant calibration parameter $X_4$, an impedance close to the open impedance and an impedance close to the impedance whose resistive component is zero and whose capacitive reactance component is 50Ω are used so as to enclose the fourth quadrant.

From FIG. 4(b), with the use of the quadrant-specific calibration parameter X', the current signal $I_1$ and the voltage signal $V_1$ can be converted to a current signal $I_2$ and a voltage signal $V_2$ obtained as a result of the quadrant-specific calibration. Specifically, the current signal $I_2$ and the voltage signal $V_2$ obtained as a result of the quadrant-specific calibration can be calculated by the following Equations (9) and (10) derived from FIG. 4(b).

$$\begin{bmatrix} V_1 \\ V_2 \end{bmatrix} = \begin{bmatrix} X'_{11} & X'_{12} \\ X'_{21} & X'_{22} \end{bmatrix} \begin{bmatrix} I_1 \\ -I_2 \end{bmatrix} \quad (9)$$

$$V_1 = X'_{11} \cdot I_1 - X'_{12} \cdot I_2$$

$$V_2 = X'_{21} \cdot I_1 - X'_{22} \cdot I_2$$

$$I_2 = \frac{X'_{11}}{X'_{12}} \cdot I_1 - \frac{1}{X'_{12}} \cdot V_1$$

$$V_2 = \frac{(X'_{12} \cdot X'_{21} - X'_{11} \cdot X'_{22})}{X'_{12}} \cdot I_1 + \frac{X'_{22}}{X'_{12}} \cdot V_1 \quad (10)$$

When the impedance of the plasma processing apparatus 4 varies, the reflection coefficient phase angle φ calculated by the reflection coefficient phase angle calculation unit 384 varies as well. If the impedance moves to another quadrant of the Smith chart, the determination result input from the quadrant determining unit 385 is switched as well, and the quadrant-specific calibration parameter X' used by the second calibration unit 386 is also switched. In other words, the second calibration unit 386 switches the calibration parameter used as the quadrant-specific calibration parameter X' to a calibration parameter with which highly accurate calibration can be performed in the corresponding quadrant according to the measured impedance.

Reverting to FIG. 3, the vector inverse transforming unit 387 calculates a current effective value I', a voltage effective value V' and a phase difference θ' obtained as a result of the calibration from the current signal $I_2$ and the voltage signal $V_2$ obtained as a result of the quadrant-specific calibration input from the second calibration unit 386 and outputs the current effective value I', the voltage effective value V' and the phase difference θ'.

The impedance calculation circuit 39 is a circuit that calculates impedance. The impedance calculation circuit 39 calculates an impedance Z by using Equations (1) to (3) given above from the current effective value I', the voltage effective value V' and the phase difference θ' obtained as a result of the calibration input from the calibration circuit and outputs the impedance Z. The high frequency measurement apparatus 3 also calculates and outputs high frequency parameters such as a traveling wave power Pf and a reflected wave power Pr, but the constituent elements that calculate these parameters are not illustrated in FIG. 3.

The procedure of calibration performed by the high frequency measurement apparatus 3 will be described next with reference to the flowchart shown in FIG. 7.

Figure 7:
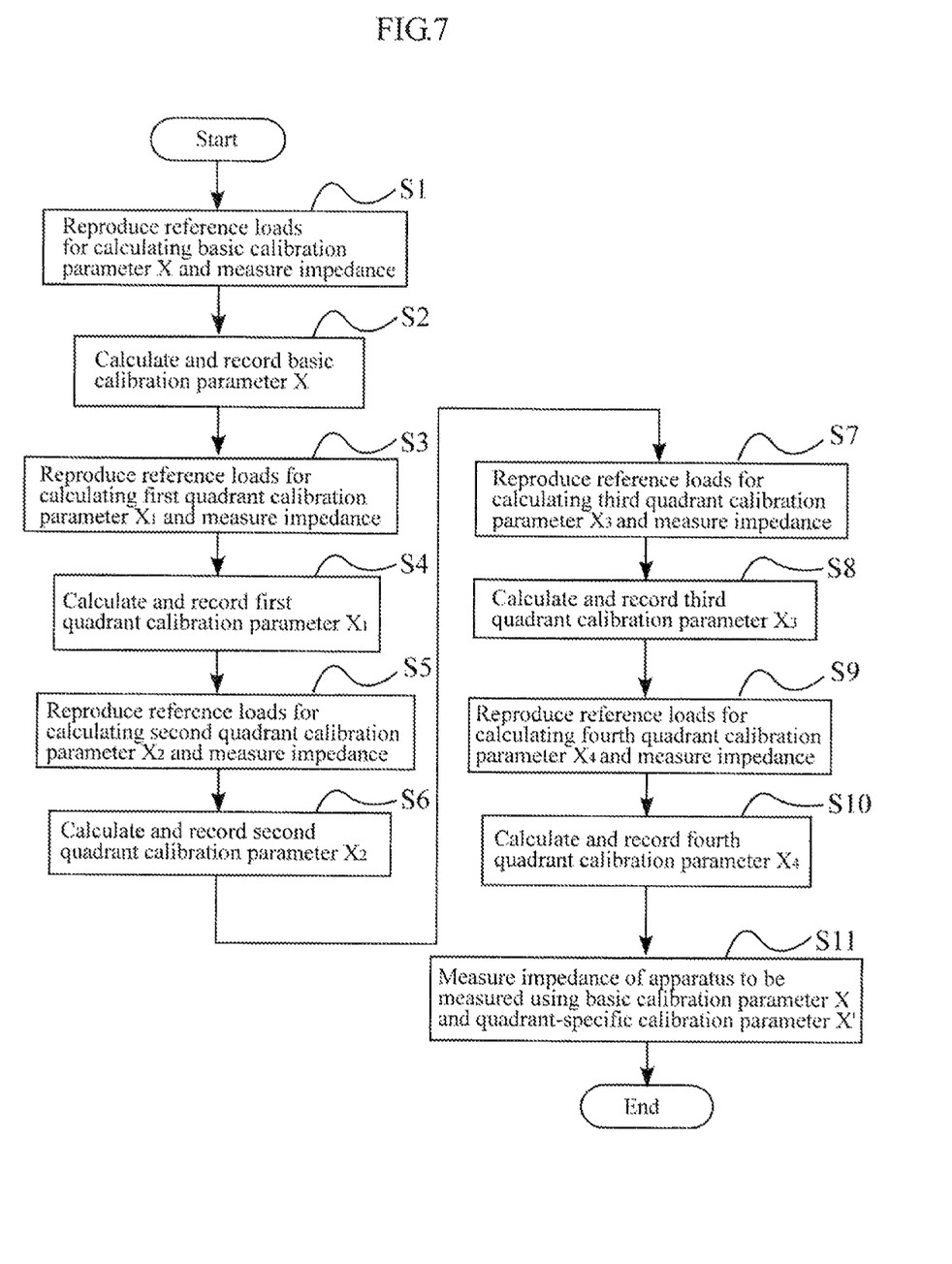
FIG. 7 is a flowchart illustrating the procedure of calibration performed by the high frequency measurement apparatus according to the first embodiment.

FIG. 7 is a flowchart illustrating the procedure of calibration performed by the high frequency measurement apparatus 3. This flowchart illustrates the process for calibrating the detected current signal $I_0$ and voltage signal $V_0$ when the impedance of the plasma processing apparatus 4 is measured by the high frequency measurement apparatus 3.

First, the high frequency measurement apparatus 3 is connected to the dummy load 6 and the impedance analyzer 7 (see FIG. 5), a reference load for calculating the basic calibration parameter X is reproduced by the dummy load 6, and the impedance is measured by the impedance analyzer 7 and the high frequency measurement apparatus 3 (S1). As the reference load, three reference loads are set, so that each reference load is reproduced and the impedance is measured by the impedance analyzer 7 and the high frequency measurement apparatus 3. As the reference load, a reference load having a characteristic impedance of 50Ω and two reference loads that are close to the open impedance and the short-circuit impedance, respectively, and that have a reflection coefficient of 0.9 or less are used.

The basic calibration parameter X is calculated from the impedances of the three reference loads measured by the impedance analyzer 7 and the high frequency measurement apparatus 3 in step S1, and recorded in the memory (not shown) provided in the high frequency measurement apparatus 3 (S2). In the present embodiment, a computation circuit (not shown) provided in the high frequency measurement apparatus 3 records the impedance calculated by the impedance calculation circuit 39 and the impedance input from the impedance analyzer 7 in the memory, calculates each element of the basic calibration parameter X after the three reference loads have been measured, and records the calculated element in the memory. The calculation of the basic calibration parameter X is not necessarily performed by the computation circuit of the high frequency measurement apparatus 3, and may be performed, for example, separately by an operator. In this case, the operator may input the basic calibration parameter X by using an input means (not shown) of the high frequency measurement apparatus 3 and record the parameter in the memory.

Next, a reference load for calculating the first quadrant calibration parameter $X_1$ is reproduced by the dummy load 6, and the impedance is measured by the impedance analyzer 7 and the high frequency measurement apparatus 3 (S3). As the reference load, three reference loads are set, so that each reference load is reproduced and the impedance is measured by the impedance analyzer 7 and the high frequency measurement apparatus 3. As the reference load, a reference load having a characteristic impedance of 50Ω and two reference loads that are close to the open impedance and the impedance whose resistive component is zero and whose inductive reactance component is 50Ω, respectively, and that have a reflection coefficient of 0.9 or less are used.

The first quadrant calibration parameter $X_1$ is calculated from the impedances of the three reference loads measured by the impedance analyzer 7 and the high frequency measurement apparatus 3 in step S3 and recorded in the memory of the high frequency measurement apparatus 3 (S4). In the present embodiment, the computation circuit of the high (frequency measurement apparatus 3 records the impedance calculated by the impedance calculation circuit 39 and the impedance input from the impedance analyzer 7 in the memory, calculates each element of the first quadrant calibration parameter $X_1$ after the three reference loads have been measured, and records the calculated element in the memory. The calculation of the first quadrant calibration parameter $X_1$ is not necessarily performed by the computation circuit of the high frequency measurement apparatus 3, and may be performed, for example, separately by an operator. In this case, the operator may input the first quadrant calibration parameter $X_1$ by using an input means (not shown) of the high frequency measurement apparatus 3 and record the parameter in the memory.

In the same manner as in steps S3 and S4, the second quadrant calibration parameter $X_2$ is calculated and recorded in the memory in steps S5 and S6. The third quadrant calibration parameter $X_3$ is calculated and recorded in the memory in steps S7 and S8. The fourth quadrant calibration parameter $X_4$ is calculated and recorded in the memory in steps S9 and S10.

Next, the high frequency measurement apparatus 3 is disposed for actual use in the plasma processing system A (see FIG. 2), and the impedance of the plasma processing apparatus 4 during plasma processing is measured (S11). At this time, the high frequency measurement apparatus 3 determines a calibration parameter used as the quadrant-specific calibration parameter X' by using the reflection coefficient phase angle φ calculated based on the current signal $I_1$ and the voltage signal $V_1$ obtained as a result of the basic calibration. Then, the high frequency measurement apparatus 3 calibrates the current signal $I_0$ and the voltage signal $V_0$ by using the basic calibration parameter X and the quadrant-specific calibration parameter X' recorded in the memory, and calculates an impedance Z from the current effective value I', the voltage effective value V' and the phase difference θ' calculated based on the current signal $I_2$ and the voltage signal $V_2$ obtained as a result of the quadrant-specific calibration. The accuracy of the calibration using the quadrant-specific calibration parameter X' is sufficiently high, so that the current signal $I_0$ and the voltage signal $V_0$ can be calibrated with high accuracy. Accordingly, the current effective value I', the voltage effective value V' and the impedance Z measured by the high frequency measurement apparatus 3 are highly accurate and thus reliable.

The procedure of calibration described above is the procedure performed in the case where the basic calibration parameter X and the quadrant calibration parameters $X_1$ to $X_4$ are not recorded in the memory of the high frequency measurement apparatus 3. Steps S1 to S10 are not necessarily performed each time, and may be performed once and the basic calibration parameter X and the quadrant calibration parameters $X_1$ to $X_4$ recorded in the memory. This process may be performed by the manufacturer when the high frequency measurement apparatus 3 is manufactured.

As described above, in the present invention, two-stage calibration is performed. Specifically, calibration using a basic calibration parameter X with which calibration can be performed in a wide impedance range but with low accuracy is performed first. Next, calibration using a quadrant-specific calibration parameter X' with which calibration can be performed with high accuracy but in a narrow impedance range is performed. Based on the current signal $I_1$ and the voltage signal $V_1$ obtained as a result of calibration using the basic calibration parameter X, it is determined in which quadrant of the Smith chart the impedance of the measurement target lies, and a calibration parameter with which highly accurate calibration can be performed in the determined quadrant is used as the quadrant-specific calibration parameter X'. Accordingly, the detected voltage and current can be calibrated with high accuracy.

In the above embodiment (hereinafter referred to as the "first embodiment"), the quadrant determining unit 385 determines in which quadrant the impedance of the measurement target lies in accordance with the reflection coefficient phase angle φ calculated by the reflection coefficient phase angle calculation unit 384, and therefore if the impedance frequently varies over a border between two quadrants, the quadrant-specific calibration parameter X' used by the second calibration unit 386 is frequently switched. In order to avoid this, in a second embodiment described below, hysteresis characteristics are provided in determination performed by the quadrant determining unit 385.

Hereinafter, a high frequency measurement apparatus according to a second embodiment will be described with reference to FIGS. 8 and 9.

Figure 8:
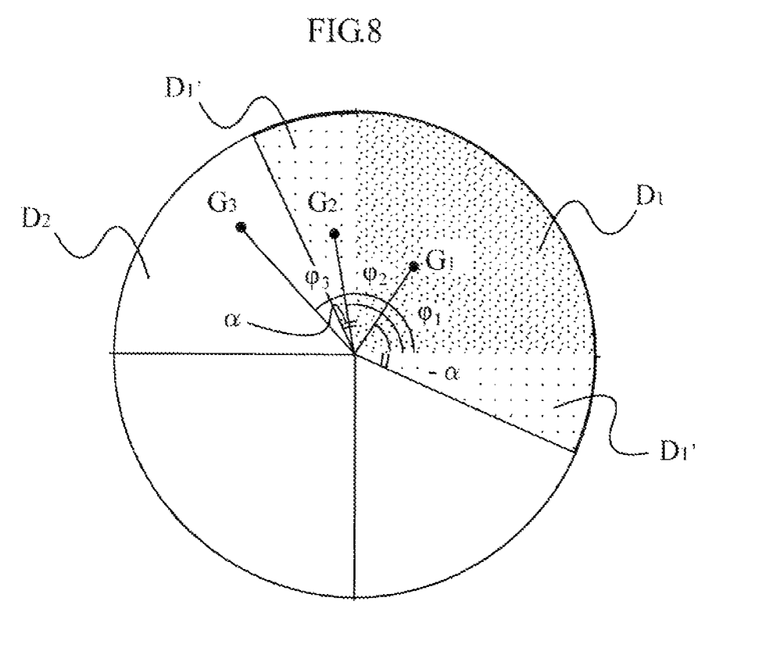
FIG. 8 is a diagram illustrating a calibration method performed by a high frequency measurement apparatus according to a second embodiment of the present invention.

FIG. 8 is a diagram illustrating the concept of a calibration method performed by a high frequency measurement apparatus according to the second embodiment, which is used to describe quadrant switching.

In FIG. 8, a range $D_1$ indicates the range of the first quadrant, and point $G_1$ indicates the position of the impedance of a measurement target. In this example, the reflection coefficient phase angle $\phi_1$ of the measurement target is $0 \leq \phi_1 < (1/2)\pi$, and thus the impedance lies in the range $D_1$ that is the first quadrant. Accordingly, the first quadrant calibration parameter $X_1$ is used as the quadrant-specific calibration parameter $X'$ to perform quadrant-specific calibration. Next, if the position of the impedance of the measurement target moves to point $G_2$, the reflection coefficient phase angle $\phi_2$ of the measurement target is $(1/2)\pi \leq \phi_2 < \pi$, and thus the impedance lies in a range $D_2$ that is the second quadrant. However, in the present embodiment, a range $D_1'$ shown in FIG. 8 is set as an expanded first quadrant including the range $D_1$, and therefore the quadrant-specific calibration parameter $X'$ is not switched as long as the position of the impedance lies in the range $(D_{1+}D_1')$ that is the expanded first quadrant, or in other words, as long as the phase angle $\phi$ satisfies $-\alpha \leq \phi < (1/2)\pi+\alpha$. Accordingly, although the impedance lies in the second quadrant, quadrant-specific calibration is performed by using the first quadrant calibration parameter $X_1$ as the quadrant-specific calibration parameter $X'$. Next, if the position of the impedance of the measurement target moves to point $G_3$, the reflection coefficient phase angle $\phi_3$ of the measurement target is $(1/2)\pi+\alpha \leq \phi_3 < \pi$, and thus the impedance does not lie in the range $(D_{1+}D_1')$, which is the expanded first quadrant, and lies in the range $D_2$, which is the second quadrant. Accordingly, quadrant-specific calibration is performed by using the second quadrant calibration parameter $X_2$ as the quadrant-specific calibration parameter $X'$.

A high frequency measurement apparatus 3' according to the second embodiment has the same internal configuration as that of the high frequency measurement apparatus 3 shown in FIG. 3. The high frequency measurement apparatus 3' differs from the high frequency measurement apparatus 3 of the first embodiment in the processing method of determination performed by the quadrant determining unit 385.

Figure 9:
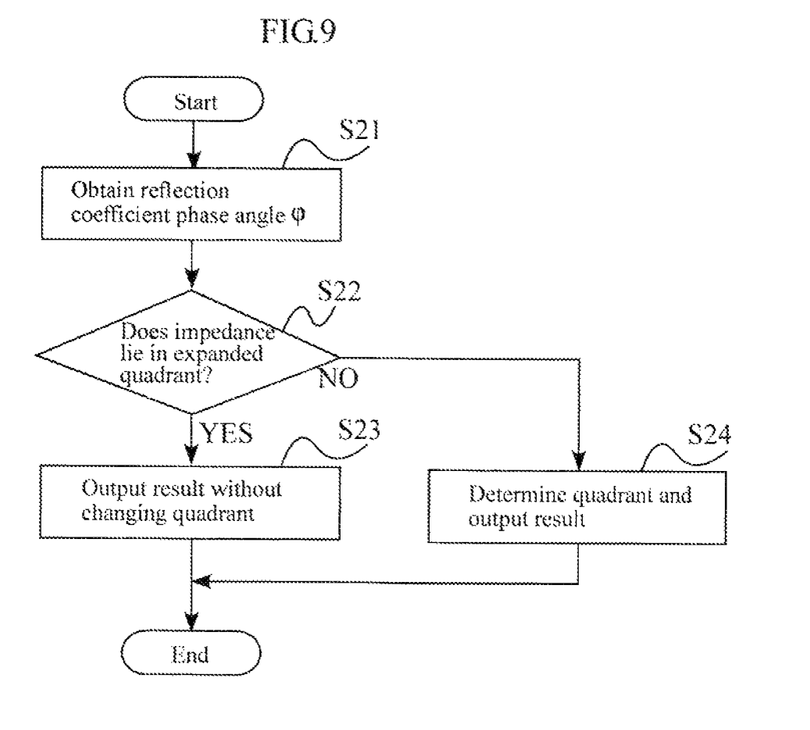
FIG. 9 is a flowchart illustrating processing of determination performed by a quadrant determining unit of the high frequency measurement apparatus according to the second embodiment.

FIG. 9 is a flowchart illustrating processing of determination performed by the quadrant determining unit 385 according to the second embodiment. The determination processing starts upon input of the reflection coefficient phase angle $\phi$ from the reflection coefficient phase angle calculation unit 384.

First, the reflection coefficient phase angle $\phi$ input from the reflection coefficient phase angle calculation unit 384 is obtained (S21). Next, it is determined whether the impedance of the measurement target lies in the expanded quadrant of the quadrant that was determined by the previous determination as the quadrant in which the impedance lay (S2). This determination is made by deciding whether or not the reflection coefficient phase angle $\phi$ falls within a predetermined angle range indicating the range of the expanded quadrant. Specifically, in the case where it was determined by the previous determination that the impedance of the measurement target lay in the first quadrant, the determination is made by deciding whether or not the reflection coefficient phase angle cp falls within a range of $-\alpha \leq \phi < (1/2)\pi+\alpha$. In the case where it was determined by the previous determination that the impedance of the measurement target lay in the second quadrant, the determination is made by deciding whether or not the reflection coefficient phase angle $\phi$ falls within a range of $(1/2)\pi-\alpha \leq \phi < \pi+\alpha$. In the case where it was determined by the previous determination that the impedance of the measurement target lay in the third quadrant, the determination is made by deciding whether or not the reflection coefficient phase angle $\phi$ falls within a range of $\pi-\alpha \leq \phi < (3/2)\pi+\alpha$. In the case where it was determined by the previous determination that the impedance of the measurement target lay in the fourth quadrant, the determination is made by deciding whether or not the reflection coefficient phase angle $\phi$ falls within a range of $(3/2)\pi-\alpha \leq \phi < 2\pi+\alpha$. Here, $\alpha$ is preset according to the measurement target within a range of $0 < \alpha < (1/4)\pi$. If a large value is set as $\alpha$, the expanded quadrant will be large, and therefore the effect of suppressing frequent switching of the quadrant-specific calibration parameter $X'$ will be increased. However, the calibration accuracy decreases because the quadrant-specific calibration parameter $X'$ is not switched. If, on the other hand, a small value is set as $\alpha$, the calibration accuracy increases because a more appropriate quadrant-specific calibration parameter $X'$ is used. However, the effect of suppressing frequent switching of the quadrant-specific calibration parameter $X'$ will be reduced. In the case where the quadrant determination is performed for the first time, because no quadrant has been determined by a previous determination, the procedure advances to step S24, where the quadrant determination is performed.

If it is determined in step S22 that the impedance of the measurement target lies in the range of the expanded quadrant (YES in S22), the quadrant is not changed, and a determination result indicating the quadrant is output to the second calibration unit 386 (S23), and the determination processing ends.

If, on the other hand, it is determined in step S22 that the impedance of the measurement target does not lie in the range of the expanded quadrant (No in S22), it is determined in which quadrant the impedance of the measurement target lies, the determination result is output to the second calibration unit 386 (S24), and the determination processing ends. This determination is made based on the reflection coefficient phase angle $\phi$ as in the determination performed by the quadrant determining unit 385 of the first embodiment.

In the second embodiment, even if the impedance of the measurement target varies and moves to another quadrant, the determination result output from the quadrant determining unit 385 is not changed as long as the impedance falls within the range of the expanded quadrant, and therefore the quadrant-specific calibration parameter $X'$ used by the second calibration unit 386 is not switched. Accordingly, even if the impedance of the measurement target frequently varies over a border between two quadrants, it is possible to suppress a situation in which the quadrant-specific calibration parameter $X'$ used by the second calibration unit 386 is frequently switched.

The first and second embodiments above have been described in the context where the number of divided ranges is four, namely, where the reflection coefficient phase angle $\phi$ is 0 to $(1/2)\pi$ (the first quadrant), where the reflection coefficient phase angle $\phi$ is $(1/2)\pi$ to $\pi$ (the second quadrant), where the reflection coefficient phase angle $\phi$ is $\pi$ to $(3/2)\pi$ (the third quadrant) and where the reflection coefficient phase angle $\phi$ is $(3/2)\pi$ to $2\pi$ (the fourth quadrant), but the present invention is not limited thereto. The borders between ranges may be set in any way, and the ranges may not have an equal size. The number of divided ranges is not limited to four. For example, the number of divided ranges may be eight by dividing each quadrant into two, or may be two including a range consisting of a combination of the first quadrant and the second quadrant and a range consisting of a combination of the third quadrant and the fourth quadrant. As the number of divided ranges increases, the size of each range decreases, and therefore the calibration accuracy increases. However, the number of calibration parameters recorded in the memory increases as well, and therefore the work load for recording the calibration parameters increases as well.

The first and second embodiments have been described in the case where the range is divided based on the reflection coefficient phase angle $\phi$, but the present invention is not limited thereto. For example, the range may be divided based on the magnitude of reflection coefficient |Γ|.

Figure 10:
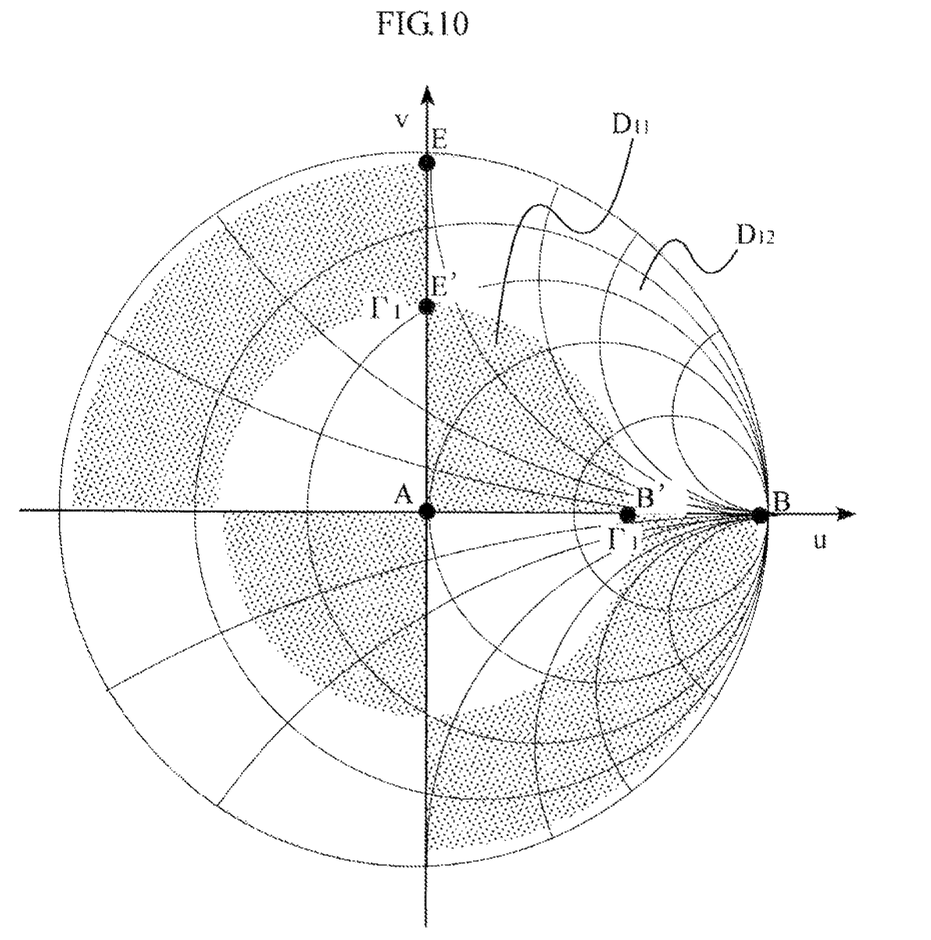
FIG. 10 shows another example in which the range of the Smith chart is divided into a plurality of ranges.

FIG. 10 shows an example in which each range obtained by dividing the range of the Smith chart into four based on the phase angle φ is further divided into two based on the magnitude of reflection coefficient |Γ|. In this case, a configuration may be used in which the reflection coefficient phase angle calculation unit 384 calculates and outputs the magnitude of reflection coefficient |Γ|, and the quadrant determining unit 385 determines in which range the impedance lies based on the reflection coefficient phase angle φ and the magnitude of reflection coefficient |Γ| (it is determined whether or not |Γ|≤Γ$_1$ is satisfied). Here, it is necessary to calculate the calibration parameter of each range and record the parameter in the memory in advance. For example, in the case where, in the first quadrant, a range of |Γ|≤Γ$_1$ is set as a range D$_{11}$ and a range of |Γ|>Γ$_1$ is set as a range D$_{12}$, it is necessary to calculate a calibration parameter for use when the impedance lies in the range D$_{11}$ by using the impedances of points A, B' and E' as a reference and a calibration parameter for use when the impedance lies in the range D$_{12}$ by using the impedances of points A, B and E as a reference, and record the obtained calibration parameters. The calibration parameter for use when the impedance lies in the range D$_{12}$ is the same as the calibration parameter for use when the first quadrant is not divided, and therefore the calibration accuracy is the same as that when the range of the Smith chart is divided into quadrants. However, when the impedance lies in the range D$_{11}$, calibration can be performed with higher accuracy.

The range of the Smith chart may be divided based on, for example, the resistance value or reactance, rather than based on the reflection coefficient phase angle φ, and may be divided using a horizontal line and a vertical line.

The high frequency measurement apparatus and the calibration method for a high frequency measurement apparatus according to the present invention are not limited to the embodiments given above. Also, the specific configurations of the constituent elements of the high frequency measurement apparatus of the present invention can be designed and changed in various ways.

The invention claimed is:

1. A high frequency measurement apparatus that is connected to a connection point between a load including a plasma processing apparatus and a high frequency power source apparatus and that detects high frequency voltage and high frequency current at the connection point, the high frequency measurement apparatus comprising:
a voltage detector for detecting high frequency voltage at the connection point;
a current detector for detecting high frequency current at the connection point;
a calibrator for calibrating a voltage value detected by the voltage detector and a current value detected by the current detector; and
an impedance calculator for calculating an impedance as viewed from the connection point toward the load based on the voltage value and current value calibrated by the calibrator,
wherein the calibrator comprises:
a first calibration unit for calibrating the detected voltage value and current value by using a basic parameter calculated based on three impedances calculated by the impedance calculator when the high frequency measurement apparatus is connected to each of three basic reference loads and impedances of the three basic reference loads;
a determiner for determining in which range an impedance calculated from the voltage value and current value calibrated by the first calibration unit lies when the impedance is indicated in a Smith chart whose entire impedance range is divided into a plurality of ranges; and
a second calibration unit for further calibrating the voltage value and current value calibrated by the first calibration unit by using a range-specific parameter calculated based on three impedances calculated by the impedance calculator when the high frequency measurement apparatus is connected to each of three range-specific reference loads having three impedances that enclose a range determined to be the range in which the impedance lies by the determiner and impedances of the three range-specific reference loads.

2. The high frequency measurement apparatus according to claim 1, wherein the range that is divided into a plurality of ranges is divided by a straight line passing through a point indicating a characteristic impedance serving as a center in the Smith chart.

3. The high frequency measurement apparatus according to claim 2, wherein the range that is divided into a plurality of ranges is divided into four by a straight line passing through a point indicating an open impedance and a straight line orthogonal to the straight line.

4. The high frequency measurement apparatus according to claim 2, wherein the determiner determines in which range the impedance lies based on a reflection coefficient phase angle calculated from the voltage value and current value calibrated by the first calibration unit.

5. The high frequency measurement apparatus according to claim 1, wherein the determiner provides hysteresis characteristics to a timing at which a determination result thereof is switched.

6. The high frequency measurement apparatus according to claim 1, wherein one of the three basic reference loads and one of the three range-specific reference loads is a load having the same impedance as a characteristic impedance of the high frequency measurement apparatus.

7. A method for calibrating high frequency voltage and high frequency current of a high frequency measurement apparatus that is connected to a connection point between a load to be measured including a plasma processing apparatus and a high frequency power source apparatus, that detects high frequency voltage and high frequency current at the connection point, and that calculates an impedance as viewed from the connection point toward the load based on a detected voltage value and current value, the method comprising:
a first step of calculating a basic parameter for calibrating the voltage value and current value based on three impedances calculated when the high frequency measurement apparatus is connected to each of three basic reference loads and impedances of the three basic reference loads, and setting the basic parameter in the high frequency measurement apparatus;
a second step of calculating a range-specific parameter for further calibrating the voltage value and current value calibrated by using the basic parameter on a range basis based on three impedances calculated when the high frequency measurement apparatus is connected to each of three reference loads having three impedances that enclose each range obtained by dividing an entire impedance range into a plurality of ranges and impedances of the three reference loads, and setting the range-specific parameter in the high frequency measurement apparatus; and a third step of connecting the high frequency measurement apparatus to the load to be measured, and calibrating the detected voltage value and current value by using the basic parameter and the range-specific parameter.

8. The calibration method according to claim 7, wherein the range-specific parameter used in the third step is a range-specific parameter corresponding to a range in which an impedance calculated based on the voltage value and current value calibrated by using the basic parameter lies.

* * * * *